United States Patent
Ngoi et al.

(10) Patent No.: US 6,555,781 B2
(45) Date of Patent: Apr. 29, 2003

(54) ULTRASHORT PULSED LASER MICROMACHINING/ SUBMICROMACHINING USING AN ACOUSTOOPTIC SCANNING DEVICE WITH DISPERSION COMPENSATION

(75) Inventors: Bryan Kok Ann Ngoi, Singapore (SG); Krishnan Venkatakrishnan, Singapore (SG)

(73) Assignee: Nanyang Technological University, Singapore (SG)

(*) Notice: Subject to any disclaimer, the term of this patent is extended or adjusted under 35 U.S.C. 154(b) by 39 days.

(21) Appl. No.: 09/898,454

(22) Filed: Jul. 5, 2001

(65) Prior Publication Data

US 2002/0023903 A1 Feb. 28, 2002

Related U.S. Application Data

(63) Continuation-in-part of application No. 09/307,710, filed on May 10, 1999, now Pat. No. 6,285,002.

(51) Int. Cl.[7] ............ B23K 26/06; B23K 26/38
(52) U.S. Cl. ............ 219/121.67; 219/121.68; 219/121.69; 219/121.8; 359/285
(58) Field of Search ........... 219/121.67, 121.68, 219/121.69, 121.7, 121.71, 121.72, 121.73, 121.74, 121.75, 121.8; 359/285, 286, 287, 316

(56) References Cited

U.S. PATENT DOCUMENTS

| | | | |
|---|---|---|---|
| 3,724,930 A | | 4/1973 | Farmer |
| 4,000,493 A | * | 12/1976 | Spaulding et al. ........... 347/239 |
| 4,216,837 A | * | 8/1980 | Pryor et al. ........... 177/1 |
| 4,360,269 A | | 11/1982 | Iwamoto et al. |
| 4,367,926 A | | 1/1983 | Hohki |
| 4,432,613 A | | 2/1984 | Ueda et al. |
| 4,469,407 A | | 9/1984 | Cowan et al. |
| 4,623,776 A | | 11/1986 | Buchroeder et al. |
| 4,642,439 A | | 2/1987 | Miller et al. |
| 4,815,802 A | | 3/1989 | Nakamura |
| 4,850,673 A | * | 7/1989 | Velzel et al. ........... 250/201.5 |
| 5,034,903 A | | 7/1991 | Alfano et al. |
| 5,034,951 A | | 7/1991 | Edelstein et al. |
| 5,041,716 A | | 8/1991 | Wakabayashi |
| 5,045,719 A | | 9/1991 | Ayral et al. |
| 5,225,924 A | * | 7/1993 | Ogawa et al. ........... 250/235 |
| 5,235,606 A | | 8/1993 | Nourou et al. |

(List continued on next page.)

FOREIGN PATENT DOCUMENTS

| DE | 19733195 A1 | * | 2/1999 |
|---|---|---|---|
| WO | 99/55487 | | 11/1999 |

OTHER PUBLICATIONS

US 2002/0023903A1 Ann Ngoi et al. (Feb. 28, 2002).*

Primary Examiner—Tom Dunn
Assistant Examiner—Kiley Stoner
(74) Attorney, Agent, or Firm—Burns, Doane, Swecker & Mathis, LLP

(57) ABSTRACT

A method and apparatus for precision laser scanning suitable for precision machining or cleaning using an ultrashort pulsed laser beam are disclosed. The apparatus employs a laser source that emits a pulsed laser beam, a dispersion compensation scanner that scans the pulsed laser beam, and a focusing unit that focuses the pulsed laser beam from the dispersion compensation scanner on a work piece. The dispersion compensation scanner comprises a first scanning device that scans the pulsed laser beam in a first direction and that causes dispersion of the pulsed laser beam. The dispersion compensation scanner further comprises a first dispersion compensation device that compensates for the dispersion caused by the first scanning device. Effects of polarization of the ultrashort pulsed laser beam on the quality of machining are described. Uses of the invention in direct fabrication of photolithographic masks and in work piece cleaning are also described.

49 Claims, 12 Drawing Sheets

U.S. PATENT DOCUMENTS

| | | | |
|---|---|---|---|
| 5,237,149 A | | 8/1993 | Macken |
| 5,547,716 A | * | 8/1996 | Thaler ........................ 427/572 |
| 5,555,254 A | | 9/1996 | Injeyan et al. |
| 5,656,186 A | | 8/1997 | Mourou et al. |
| 5,670,069 A | | 9/1997 | Nakai et al. |
| 5,680,253 A | * | 10/1997 | Hasegawa ................... 359/566 |
| 5,720,894 A | | 2/1998 | Neev et al. |
| 5,736,709 A | * | 4/1998 | Neiheisel ............... 219/121.61 |
| 5,745,308 A | | 4/1998 | Spangenberg |
| 5,761,111 A | | 6/1998 | Glezer |
| 5,768,017 A | | 6/1998 | King et al. |
| 5,771,260 A | * | 6/1998 | Elliott et al. ................ 372/109 |
| 5,786,560 A | | 7/1998 | Tatah et al. |
| 5,859,424 A | | 1/1999 | Norton et al. |
| 5,936,732 A | | 8/1999 | Smirl et al. |
| 5,955,721 A | * | 9/1999 | Dickson et al. ........ 235/462.01 |
| 5,995,281 A | * | 11/1999 | Simon et al. ................ 359/368 |
| 6,008,914 A | | 12/1999 | Sasagawa et al. |
| 6,011,874 A | | 1/2000 | Gluckstad |
| 6,031,201 A | | 2/2000 | Amako et al. |
| 6,034,348 A | | 3/2000 | Kim et al. |
| 6,111,645 A | * | 8/2000 | Tearney et al. ............. 356/484 |
| 6,150,630 A | | 11/2000 | Perry et al. |
| 6,166,385 A | * | 12/2000 | Webb et al. ............. 250/458.1 |
| 6,178,029 B1 | * | 1/2001 | Kamikubo .................. 250/236 |
| 6,268,586 B1 | * | 7/2001 | Stuart et al. ........... 219/121.67 |
| 6,282,011 B1 | * | 8/2001 | Tearney et al. ............. 359/287 |
| 6,285,002 B1 | * | 9/2001 | Ngoi et al. ............. 219/121.68 |
| 6,288,831 B1 | * | 9/2001 | Iizuka ........................ 359/308 |
| 6,333,485 B1 | * | 12/2001 | Haight et al. .......... 219/121.68 |
| 6,344,653 B1 | * | 2/2002 | Webb et al. ............. 250/458.1 |
| 6,356,088 B1 | * | 3/2002 | Simon et al. ................ 250/311 |

* cited by examiner

VIEW AA

VIEW BB

● - P-Polarization

↑ - S-Polarization

↻ - Circular Polarization

✷ - Random Polarization

ULTRASHORT PULSED LASER MICROMACHINING/ SUBMICROMACHINING USING AN ACOUSTOOPTIC SCANNING DEVICE WITH DISPERSION COMPENSATION

This disclosure is a continuation-in-part of U.S. patent application No. 09/307,710 now U.S. Pat. No. 6,285,002 B1 entitled "Three Dimensional Micro Machining with a Modulated Ultra-Short Laser Pulse" filed on May 10, 1999, the entire contents of which are incorporated herein by reference.

BACKGROUND

The present invention relates to precision laser scanning for machining or cleaning a work piece. More particularly, the present invention relates to a method and apparatus for high precision laser scanning for micro machining, submicro machining, or cleaning using an ultrashort pulsed laser beam and an acoustooptical deflection device. The present invention is useful for high-precision machining of a variety of structures, including photolithographic masks. The invention is not intended to be limited to the above-noted uses, however.

Laser machining has significant applications in the automobile, aerospace and electronics industries for cutting, drilling and milling. Salient features of laser machining include the ability to make small and unique structures and the ability to process hard-to-work materials such as ceramics, glasses and composite materials. High-power $CO_2$ and YAG lasers are conventionally used for laser machining. However, conventional laser machining suffers from problems including rough machining kerf, existence of a recast layer and large heat-affected zone, and restriction to large feature sizes. Hence, conventional laser machining is not suitable for precision micromachining.

In contrast, in machining based upon ultrashort pulsed lasers, the mechanism of material removal is different from that of conventional lasers. Moreover, the heat affected zone is negligibly small, and the melt zone is virtually absent in ultrashort pulsed laser machining. Hence, laser machining using ultrashort laser pulses is suitable for precision micromachining.

One aspect of ultrashort pulsed laser machining (also referred to as ablation) of interest is the effect of beam polarization. PCT Patent Publication No. WO 99/55487 entitled "Method and apparatus for improving the quality and efficiency of ultrashort-pulse laser machining" by Hoang et al. discloses controlling the polarization of an ultrashort pulsed laser beam in a machining process. However, the physical mechanism underlying the relationship between polarization and its effect on machining has not been explained.

In addition, in conventional ultrashort pulsed laser machining, features are generated by scanning the ultrashort pulsed laser beam using mechanical scanning systems, such as galvano mirrors. A main disadvantage of these systems is that they are prone to vibration, which can adversely affect the positional accuracy of the scanned beam. This effect can be very detrimental in attempts to machine features of submicron size. Also, the use of mechanical scanning systems limits scanning speed and spatial resolution of the system.

Applicants have recognized that using acoustooptic devices instead of mechanical systems for beam scanning can avoid the above-noted vibration problem. Applicants have also recognized that the use of acoustooptic devices can lead to noticeable dispersion of the ultrashort pulsed laser beam. It would be desirable to have an ultrashort pulsed laser scanning system where dispersion from acoustooptic devices is compensated.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In one aspect of the invention, a precision laser-scanning apparatus is provided. The precision laser-scanning apparatus comprises a laser source that emits a pulsed laser beam, a dispersion compensation scanner that scans the pulsed laser beam, and a focusing unit that focuses the pulsed laser beam from the dispersion compensation scanner on a work piece. The dispersion compensation scanner comprises a first scanning device that scans the pulsed laser beam in a first direction and that causes dispersion of the pulsed laser beam. The dispersion compensation scanner further comprises a first dispersion compensation device that compensates for the dispersion caused by the first scanning device.

The pulsed laser beam may have a wavelength in the range of approximately 100 nm to approximately 1500 nm, a pulse width in the range of approximately 1 microsecond to approximately 1 femtosecond, and a pulse repetition rate in the range of approximately 10 hertz to approximately 80 megahertz. In addition, the dispersion compensation scanner may have a scanning resolution in the range of approximately 1 nanometers to approximately 100 micrometer depending on the scanning range. Further, the dispersion compensation scanner may have a scanning random access time in the range of approximately 0.01 microseconds to 100 microseconds depending on the rise time of the acoustic crystal.

In another aspect of the invention, the pulsed laser beam of the precision laser-scanning apparatus may have a pulse energy and an intensity sufficient to machine a surface of work piece. The apparatus may have a spatial machining resolution in the range of approximately 0.05 micron to approximately 100 micron. Further, the apparatus may have a spatial machining resolution of approximately one-twentieth of a cross-sectional diameter of the pulsed laser beam in a focused state at the surface of the work piece. Moreover, the apparatus may further comprise a polarization converter that provides a polarization state to the pulsed laser beam. The polarization converter may be selected from the group consisting of a quarter-wave plate, a half-wave plate, and a depolarizer. In addition, the polarization converter may be selected to provide the polarization state depending upon a desired shape of a machined feature to be generated on a surface of the work piece or depending upon an ablation threshold of the work piece. Further, the polarization state may be selected to be one of a linear polarization state for machining an elliptical feature, a circular polarization state for machining a circular feature, and a random polarization state for machining a circular feature.

In another aspect of the invention, the apparatus may further comprise a beam filter that spatially filters the pulsed laser beam and provides the pulsed laser beam with a desired cross-sectional size. The beam filter may comprise a pin hole with a diameter approximately equal to or greater than a desired spot size of the pulsed laser beam when focused onto the work piece, a first focusing lens that focuses the pulsed laser beam onto the pin hole, a second focusing lens that collimates the pulsed laser beam emanating from the pin hole, and a diaphragm that blocks an outer portion of the pulsed laser beam emanating from the second focusing lens.

In another aspect of the invention the dispersion compensation scanner may further comprise a second scanning device that scans the pulsed laser beam in a second direction different (or perpendicular) from the first direction and that causes dispersion of the pulsed laser beam, wherein the first dispersion compensation device compensates for dispersion caused by both the first scanning device and the second scanning device. The first and second scanning devices may be acoustooptic devices, and the first dispersion compensation device may be a diffraction grating having a line spacing suitable for compensating the dispersion caused by the first and second scanning devices. Alternatively, the first dispersion compensation device may be an acoustooptic device. The first and second scanning devices are acoustooptic deflectors, and the first dispersion compensation device is an acoustooptic modulator that further provides modulation of the pulsed laser beam wherein the beam is selectively transmitted or blocked with a precision ranging from 1 nanosecond to 20 microseconds. The first and second scanning devices may be oriented such that the first direction is perpendicular to the second direction, and the first dispersion compensation device may be oriented at an angle relative to the first scanning device such that the first dispersion compensation device produces a negative dispersion that counters the resultant dispersion caused by the first and second scanning devices. In addition, the dispersion compensation provided by the first dispersion compensation device may result in a dispersion error below approximately 30% over the entire scan range. The first compensation device, the first scanning device and the second scanning device may be made of the same material and may have the same acoustic velocity, and the center acoustic frequency of the first compensation device may chosen such that dispersion compensation is optimized for the entire scanning range of the apparatus.

In another aspect of the invention, the dispersion compensation scanner may further comprise a second scanning device that scans the pulsed laser beam in a second direction different from the first direction and that causes dispersion of the pulsed laser beam and may further comprise a second dispersion compensation device that compensates for dispersion caused by the second scanning device. The first and second scanning devices may be acoustooptic devices, and the first and second dispersion compensation device may be diffraction gratings having a line spacing suitable for compensating the dispersion caused by the first and second scanning devices. Alternatively, the first and second dispersion compensation devices may be acoustooptic devices. The first and second scanning devices may be acoustooptic deflectors, and the first and second dispersion compensation devices may be acoustooptic modulators that further provide modulation of the pulsed laser beam wherein the pulsed laser beam is selectively transmitted or blocked. In addition, the first and second scanning devices may be oriented such that the first direction is perpendicular to the second direction, and the first and second dispersion compensation devices may be oriented such that a direction of an acoustic wave in the first dispersion compensation device is perpendicular to a direction of an acoustic wave in the second dispersion compensation device, the first and second dispersion compensation devices producing a negative dispersion that counters the resultant dispersion caused by the first and second scanning devices. The dispersion compensation provided by the first and second dispersion compensation devices may result in a dispersion error below approximately 30% over the entire scan range. The first and second compensation devices and the first and second scanning devices may be made of the same material and have the same acoustic velocity, and a center acoustic frequency of the first and second dispersion compensation devices may be chosen such that dispersion compensation is optimized for the entire scanning range of the apparatus.

In another embodiment of the invention, a method of scanning a pulsed laser beam on a work piece for machining or cleaning the work piece is provided. The method comprises emitting a pulsed laser beam from a laser source, focusing the pulsed laser beam on the work piece, scanning the pulsed laser beam on the work piece using a first scanning device that scans the pulsed laser beam in a first direction and that causes dispersion of the pulsed laser beam, and compensating for the dispersion caused by the first scanning device using a first dispersion compensation device.

The method may further comprise machining a surface of the work piece by ablating material from the surface. In addition, the method may further comprise converting a polarization of the pulsed laser beam to a predetermined polarization state prior to scanning the pulsed laser beam on the work piece. The method may further comprise selecting the predetermined polarization state depending upon a desired shape of a machined feature to be generated on the surface of the work piece or depending upon an ablation threshold of the work piece. The method may further comprise spatially filtering the pulsed laser beam to provide the pulsed laser beam with a desired cross-sectional size.

In another aspect of the invention the method may further comprise scanning the pulsed laser beam in a second direction different from the first direction using a second scanning device that causes dispersion of the pulsed laser beam, and compensating for dispersion caused by both the first scanning device and the second scanning device using the first dispersion compensation device. The method may further comprise modulating the pulsed laser beam using the first dispersion compensation device, the first dispersion compensation device being an acoustooptic modulator. The method may further comprise scanning the pulsed laser beam in a second direction different from the first direction using a second scanning device that causes dispersion of the pulsed laser beam, and compensating for dispersion caused by the second scanning device using a second dispersion compensation device. The method may further comprise modulating the pulsed laser beam using the first and second dispersion compensation devices, the first and second dispersion compensation devices being acoustooptic modulators.

DETAILED DESCRIPTION

Figure 1:
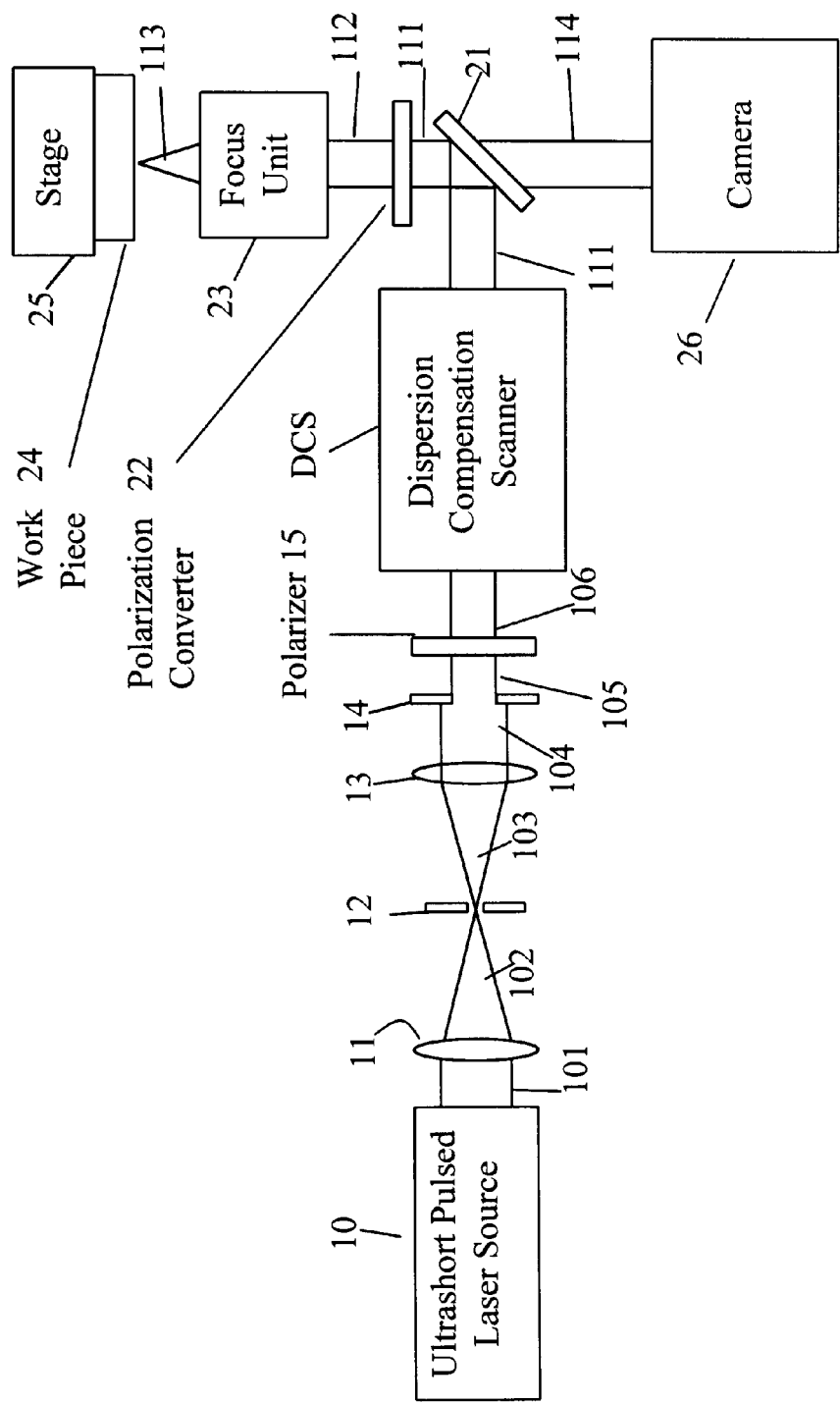
FIG. 1 is an illustration of a precision laser scanning apparatus suitable for precision machining or cleaning according to the present invention.

The present invention provides a method and apparatus for machining micron and sub-micron features into a surface of a work piece and/or cleaning a surface of a work piece using an ultrashort pulsed laser beam having pulse widths preferably of approximately 10 femtoseconds to 100 picoseconds. The machining apparatus includes a non-mechanical beam scanner comprising acoustooptic devices (also referred to as acoustooptic deflectors) to scan the laser beam in two dimensions (e.g., X and Y directions). The non-mechanical beam scanner may also be referred to as a dispersion compensation scanner as described below.

Ultrashort pulsed laser beams have a wavelength spectrum of a certain bandwidth and undergo dispersion upon on passing through conventional acoustooptic devices (e.g., modulators or deflectors) due to different Bragg angles for different wavelengths in the wavelength spectrum. Such dispersion can be detrimental to the resolution of a machining apparatus utilizing acoustooptic devices.

In the present invention, dispersion of the laser beam due to one or more acoustooptic deflectors is compensated by producing a counter-dispersion of the laser beam prior to passing the laser beam through the acoustooptic deflector, such that the counter-dispersion counters the dispersion produced by the acoustooptic deflector. Such counter-dispersion may also be referred to as compression. For example, dispersion compensation according to the present invention can be obtained by using a pair of appropriately positioned and oriented acoustooptic devices (e.g., modulators) or by using a single acoustooptic device appropriately positioned and oriented at a certain angle. The dispersion compensation acoustooptic device and the acoustooptic deflector for scanning preferably have acoustic mediums (e.g., acoustic crystals) of the same material type and acoustic velocity. For example, the material may be $TeO_2$ or other suitable acoustic crystal known to those skilled in the art. The center frequency of the dispersion-compensation acoustooptic device is preferably chosen such that the dispersion compensation error is minimized for the entire scanning range.

The scanning beam can be focused on a work piece using a focusing unit or lens, which is preferably a scanning lens, telecentric lens, or the like, positioned a distance from the dispersion compensation scanner approximately equal to the front focal length (forward working distance) of the focusing lens. The work piece is preferably positioned at approximately the back focal length (back working distance) of the focusing lens.

The shape of a machined hole generated in the surface of a work piece was found to be dependent on the polarization state of the ultrashort pulsed laser beam. For a linearly polarized ultrashort pulsed laser beam with an overall circular cross-section, the machined hole has an elliptic shape wherein the direction of the ellipticity depends on the direction of polarization of the beam. For a circularly polarized beam and a randomly polarized beam, the machined hole has a circular shape. A possible explanation for the polarization-dependent hole shape is that the laser energy is absorbed more predominantly along the direction of the electric field vector (direction of polarization). Hence, material may be predominantly ablated along the direction of the electric field vector. Accordingly, polarization can be controlled and appropriately shifted to provide optimized machining according to the present invention. For machining complex features, it is advantageous to use either circular or randomly polarized ultrashort pulsed laser beams.

In addition, it was found that the ablation threshold of most of the commonly used materials (e.g., gold, silicon, platinum, copper, aluminum, chromium, titanium, etc.) depend on the polarization state of the ultrashort pulsed laser beam. The ablation threshold was found to be a minimum for a P-polarized ultrashort pulsed laser beam and higher for an S-polarized ultrashort pulsed laser beam. For a circularly polarized ultrashort pulsed laser beam, the ablation threshold was found to be slightly higher than that for the P-polarization state.

The present invention is capable of producing feature sizes of less than one twentieth of the focused spot size of the ultrashort pulsed laser beam. This can be achieved by precisely controlling the pulsed energy slightly above the ablation threshold of the material and by precisely controlling the number of laser pulses at each target spot on the work piece. Also, an ultrashort pulsed laser beam with relatively less energy fluctuation facilitates generating smaller feature sizes. The present invention using dispersion compensation acoustooptic devices (e.g., modulators) enables very precise control of the number of pulses at each target point on the work piece to be machined. Also dispersion compensation acoustooptic devices according to the present invention can scan the ultrashort pulsed laser beam at very high scanning speed, resolution and accuracy, which are not achievable with mechanical scanning devices. Accordingly, the present invention enables machining complex micron and sub-micron features with very high speed and accuracy.

One use of the present invention is the fabrication of photolithographic masks (photomasks). Using the present invention, the absorbing layer of a mask blank can be removed directly with an ultrashort pulsed laser beam in a single-step process. The ultrashort pulsed laser beam intensity is preferably controlled such that the absorbing layer of the mask is removed without affecting the transparent substrate. The present invention can provide a fast and cost effective technique for photomask production in comparison to conventional lithographic processes and is capable of fabricating complex photomasks with micron and sub-micron features.

In addition, the present invention can be used for cleaning surfaces of work pieces by an entirely dry process. The intensity of the ultrashort pulsed laser beam is controlled such that the energy delivered to any spot on the work piece is lower than the ablation threshold of the work piece surface to be cleaned. The beam is scanned on the surface of the work piece sample one or more times depending on the requirement of cleaning efficiency. Utilizing an ultrashort pulsed laser beam for cleaning has several advantages over cleaning with long pulse width laser beams such as minimal sub-surface damage, selective-area cleaning, the ability to remove very small dust particles (smaller than 100 nm), and avoidance of damage to sensitive parts. Of course, the present invention is not intended to be limited to the above-noted uses.

Exemplary embodiments of the present invention will now be described in greater detail in reference to the figures.

Figure 4:
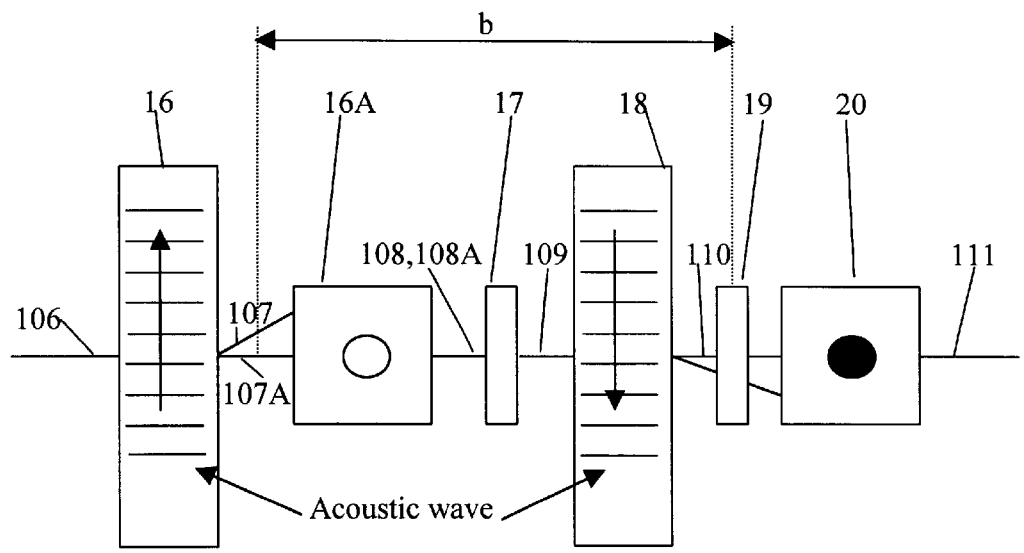
FIG. 4 is a side-view illustration of an exemplary dispersion compensation scanner in the form of a two-axis acoustooptic deflection apparatus using two acoustooptic devices for dispersion compensation according to the present invention.
Figure 6:
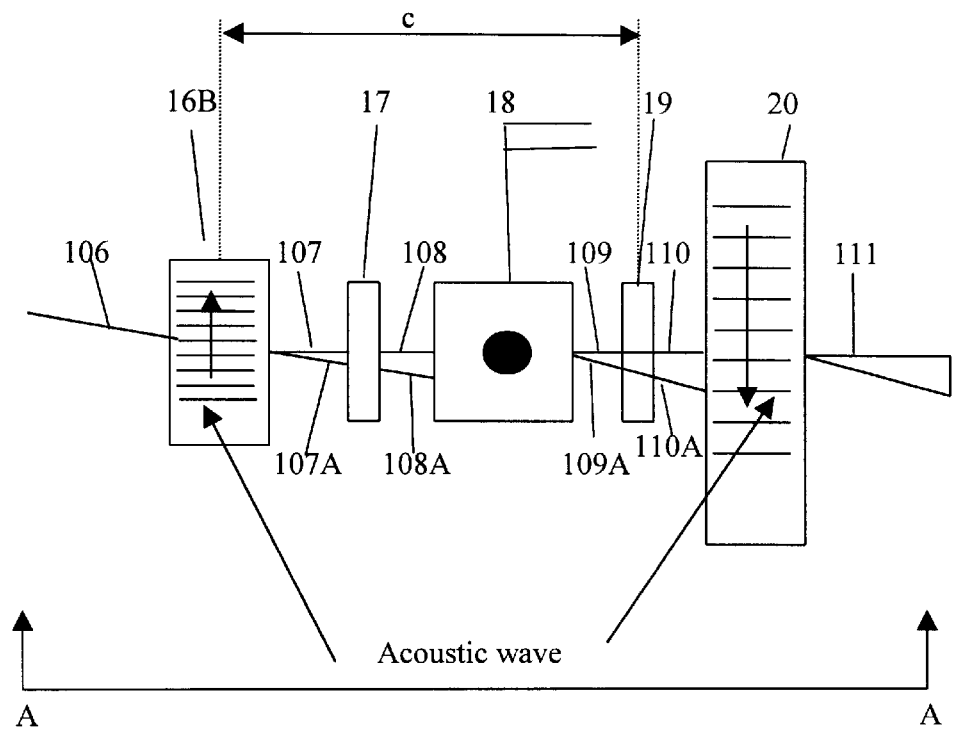
FIG. 6 is a side-view illustration showing an exemplary dispersion compensation scanner in the form of a two-axis acoustooptic deflection apparatus using a single acoustooptic device for dispersion compensation according to the present invention.

One embodiment of the invention is a precision laser scanning apparatus suitable for micro machining, sub-micro machining, or cleaning employing a dispersion compensation scanner DCS, such as illustrated in FIG. 1, for example. The exemplary apparatus illustrated in FIG. 1 employs a laser source 10, which generates an ultrashort pulsed laser beam 101, preferably of pulse width in the range of a picosecond or a femtosecond. The pulse can be an amplified pulse or an un-amplified pulse depending on the application. The apparatus is not restricted to either picosecond or femtosecond pulse widths, and pulse widths larger or smaller than those of the picosecond or femtosecond range may be used depending on the application requirement. The ultrashort pulsed laser beam 101 preferably passes through a beam filtering mechanism, which may comprise a focusing lens (objective lens) 11, an aperture (e.g., a pin hole) 12 and a focusing lens (collimating lens) 13, such as illustrated in FIG. 1. Details of the filtering mechanism will be described below. The filtered and collimated ultrashort pulsed laser beam 104 from the lens 13 then preferably passes through a circular opening or diaphragm 14, which further improves the beam quality by trimming the edge of the beam. The filtered beam 105 then preferably passes through a polarizer (e.g., a birefringent medium) 15. The beam 106 then passes through a dispersion compensation scanner DCS, which is non-mechanical and which may be a combination of three acoustooptic deflectors 16B, 18 and 20, such as illustrated in FIG. 6, o r four acoustooptic deflectors 16, 16A, 18 and 20, such as illustrated in FIG. 4. Deflectors 16 and 16A in FIG. 4 and deflector 16B in FIG. 6 may be considered dispersion compensation deflectors or dispersion compensation devices. Deflectors 16, 16A, and 16B can further serve as acoustooptic modulators for selectively blocking and transmitting the beam. The polarizer 15 is preferably a zero-order wave plate to rotate the polarization of the ultrashort pulsed laser beam for maximum efficiency of the dispersion compensation deflector 16B in the example of FIG. 6 (or the dispersion compensation deflectors 16 or 16A illustrated in the example of FIG. 4).

The scanning beam 111 from the dispersion compensation scanner DCS is deflected by a beam splitter 21 (e.g., a semitransmissive mirror), and the resulting beam 111 passes through a polarization converter (or polarization shifter) 22, which changes the polarization state of the ultrashort pulsed laser beam to different states such as circular polarization or linear polarization or elliptical polarization or random polarization, depending on the application and the machining process. The details on the effects of polarization on micro machining will be discussed below.

The polarization shifted ultrashort pulsed laser beam 112 then passes through a focusing unit (or focusing lens) 23, which is preferably a telecentric lens, scanning lens, objective lens, oil immersion lens, or the like. The beam 113 from the focusing lens 23 is focused on the surface or the work piece 24, which is mounted on a stage 25 for moving the work piece. The stage may have two or more motion axes and may provide for linear, rotational, and/or angular movement of the work piece in multiple axes or directions. The camera 26 monitors the work piece (target) surface through the beam splitter 21.

It should be noted that one or more controllers (not shown), such as in U.S. patent application No. 09/307,710 now U.S. Pat. No. 6,285,002 referred to above, can be used to control the dispersion compensation scanner DCS (for beam scanning), the laser source 10 (e.g., for beam pulse intensity), and the stage 25 (for work piece motion). In addition, the controller can control acoustooptic modulators (for beam blocking); these acoustooptic modulators can be either internal to the DCS or they can be additional devices external to the DCS. Moreover, the controller (not shown) may be connected to a computer (not shown) programmed to carry out a desired machining process as described in U.S. patent application No. 09/307,710 now U.S. Pat. No. 6,285, 002.

Figure 2A:
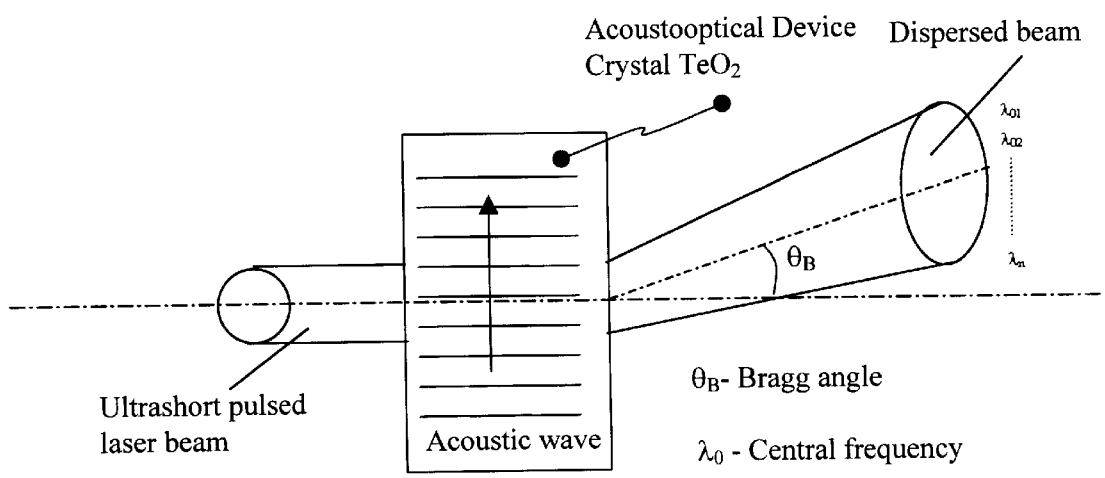
FIG. 2A is an illustration showing the phenomenon of dispersion resulting from a conventional acoustooptic deflection device.

The ultrashort pulsed laser beam is expected to have a finite wavelength bandwidth. Preferably, the wavelength bandwidth is narrow (e.g., 10–20 nm or less). This finite bandwidth leads to dispersion of the ultrashort pulsed laser beam on passing through an acoustooptic device (e.g., deflector) as illustrated in FIG. 2A. An ultrashort pulsed laser beam without dispersion compensation, when focused onto the work piece, may generate an elliptical rather than circular machined spot due to such dispersion. The extent of elliptical shape of the machined spot depends upon the distance between the acoustooptic device and the surface of the work piece, and also upon the design of the acoustooptic device. Shorter wavelength acoustic waves in the acoustic crystal of the acoustooptic device cause relatively greater dispersion. Hence, the amount of elliptical shape of the machined feature spot will be greater for shorter wavelength acoustic waves and vice versa. Also, larger distances between the work piece surface and the acoustooptic device result in a greater amount of elliptical shape of the machined feature spot.

Figure 2B:
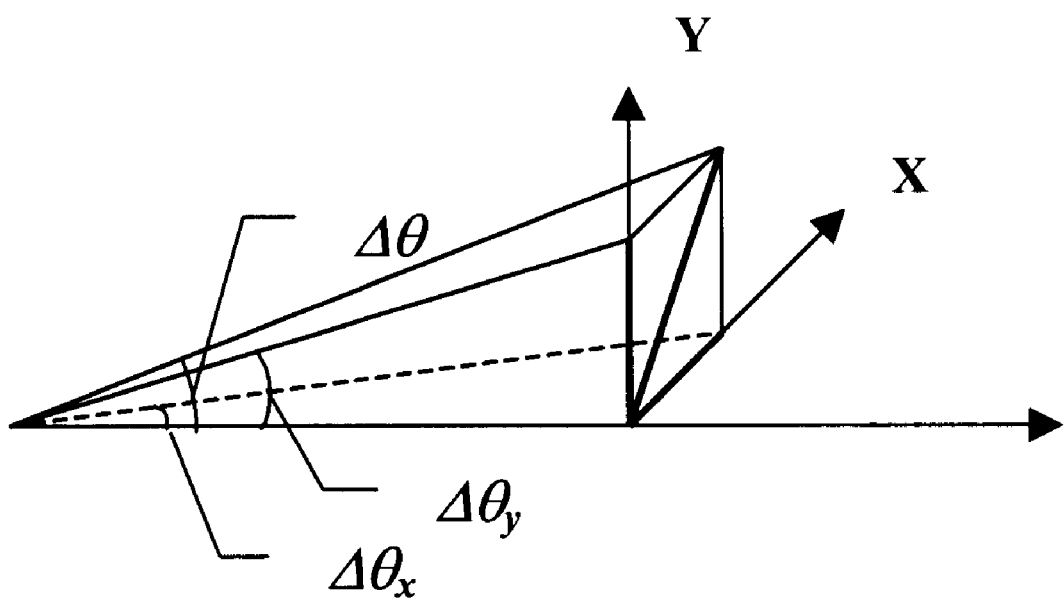
FIG. 2B is an illustration showing the resultant dispersive effect due to the two acoustooptic scanners

Dispersion occurs because acoustooptic deflectors act as moving gratings. The scanning beam is its first diffraction order. The separation angle θ between the zero-order beam and first-order diffraction beam is expressed as $$\theta = \lambda_0 f_a / v_a,$$

where $\lambda_0$ is the wavelength of the incident light, $f_a$ is the driving frequency of the deflector and $v_a$ is the velocity of the acoustic wave propagating in the crystal. As noted above, an ultrashort pulsed laser is not monochromatic light but consists of a small spectrum band (approximately 10–20 nm). The lower wavelength portion of the spectrum bandwidth will be deflected at an angle less than that of the higher wavelength portion of the spectrum. Therefore, the dispersion of laser beam occurs. The dispersion angle can be obtained from the separation angle θ

$$\Delta\theta = \lambda_1 f_a/v_a - \lambda_2 f_a/v_a = \Delta\lambda f_a/v_a,$$

where $\lambda_1$ and $\lambda_2$ represent the highest and lowest part of the spectrum bandwidth respectively and $\Delta\lambda$ stands for the bandwidth of the spectrum. The spatial profile of the laser beam will be stretched in the direction of the acoustic wave, resulting in an elliptical beam. This is illustrated in FIGS. 2A and 2B. In an exemplary apparatus according to the present invention, there can be two acoustooptic deflectors. Hence, dispersion can occur in both X and Y axes. Also, the spatial profile of the laser beam can be stretched in both axes, resulting in an elliptical spot dispersed in a diagonal manner, as shown in FIG. 2B. The final dispersion angle $\Delta\theta$ can be obtained from dispersion angles in X-axis and Y-axis, $\Delta\theta_x$ and $\Delta\theta_y$, and is given by $$\Delta\theta = \sqrt{\Delta\theta_x^2 + \Delta\theta_y^2}.$$

In order to compensate for dispersion of the pulsed laser beam, the present invention provides one or two acoustooptic devices to compensate for dispersion caused by one or more acoustooptic deflectors in the dispersion compensation scanner used for beam scanning. For example, one or two dispersion compensation acoustooptic devices may be introduced prior to a two-axis scanning acoustooptic deflector apparatus as described below. It should be noted, however, that the dispersion compensation scanner can be a single-axis scanner rather than a two-axis scanner. Moreover, diffraction gratings rather than acoustooptic devices may be employed for dispersion compensation.

A principle behind dispersion compensation according to the present invention is to produce counter-dispersion in the ultrashort pulsed laser beam prior to passing through the scanning acoustooptic device. In particular, the direction of dispersion produced by the dispersion compensation acoustooptic device is opposite to that caused by the scanning acoustooptic deflector, but the magnitude of the dispersion is the same as that produced by the scanning acoustooptic deflector. This will be described in greater detail below.

Figure 3:
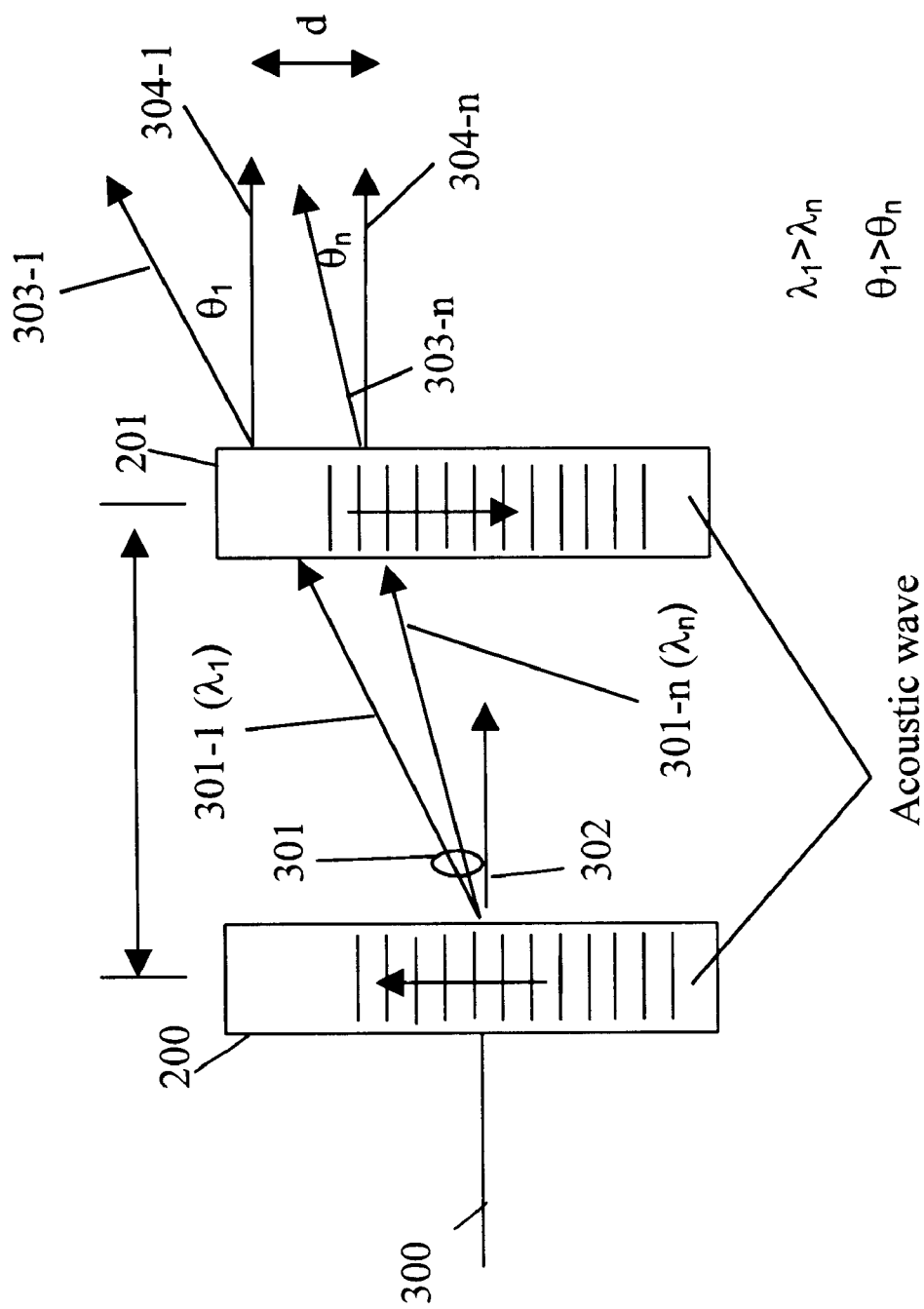
FIG. 3 is an illustration showing an approach for dispersion compensation in a single-axis acoustooptic deflection apparatus according to the present invention.

FIG. 3 illustrates exemplary dispersion and dispersion compensation in more detail. As shown in FIG. 3, beam 300 enters the acoustooptic device 200, and zero order-beam 302 and first-order beam 301 emanate from device 200. Beam 302 can be blocked with a beam block (not shown) such as described in U.S. patent application No. 09/307,710 now U.S. Pat. No. 6,285,002. Beam 301 has a narrow band of wavelengths between $\lambda_1$ and $\lambda_n$ centered about $\lambda_0$ and undergoes dispersion as a result of Bragg diffraction. Dispersed beams 301-1 and 301-n corresponding to $\lambda_1$ and $\lambda_n$, respectively, are shown, where $\lambda_1 > \lambda_n$ (for convenience, beams corresponding to other wavelengths are not shown throughout this discussion, but it will be understood that these beams are present). Given the Bragg relation well known to those skilled in the art, beam 301-1 is deflected at a larger angle than beam 301-n. As illustrated, beams 301-1 and 301-n then enter deflector 201, resulting in zero-order beams 303-1 and 303-n and first-order diffracted beams 304-1 and 304-n. Beams 303-1 and 303-n can be blocked with a beam block (not shown). The angle between beam 303-1 and beam 304-1 is $\theta_1$, and the angle between beam 303-n and beam 304-n is $\theta_n$. Again, given the Bragg relation, it can be seen that $\theta_1 > \theta_n$ because $\lambda_1 > \lambda_n$. Thus, whereas beam 301-1 was initially deflected at a greater angle than beam 301-n due to dispersion by device 200, beam 304-1 is correspondingly deflected at a greater angle than beam 304-n in the opposite direction as a result of diffraction by deflector 201. Thus, parallel beams 304-1 and 304-n (and beams at wavelengths in between) may accordingly be considered dispersion-compensated beams. In this regard, deflector 201 may be viewed as providing dispersion compensation for device 200. Equivalently, device 200 may be viewed as providing dispersion compensation for deflector 201, because if deflector 201 were provided alone, the beam would suffer dispersion similar to that indicated by beams 301-1 and 301-n.

In a single-axis scanning arrangement, such as illustrated in FIG. 3, the acoustooptic device 200 can be an acoustooptic modulator oriented at its Bragg angle $\theta_b$ for maximum efficiency. In addition, the acoustooptic deflector 201 can be oriented at its Bragg angle for maximum efficiency. In one embodiment, the acoustooptic device 200 and the acoustooptic deflector 201 are oriented such that acoustic waves in the acoustic crystals of the acoustooptic device 200 and deflector 201 travel in opposite directions to each other, the acoustooptic device 200 producing dispersion in an opposite direction to that caused by the deflector 201. Both the acoustooptic device 200 and deflector 201 can be driven at the same center frequency, and the acoustic crystals of each can be made of the same acoustic material and can have the same acoustic velocity.

Even with dispersion compensation, there can be some resultant dispersion in the emanating beam. However, the amount of this resultant dispersion can be decreased as the distance between the acoustooptic device 200 and deflector 201 is decreased. In addition, there is a finite beam width "d" corresponding to the distance between beams 304-1 and 304-n, but this beam width can be minimized by minimizing the distance between devices 200 and 201. Moreover, this beam width may be condensed using appropriate optics.

Figure 5:
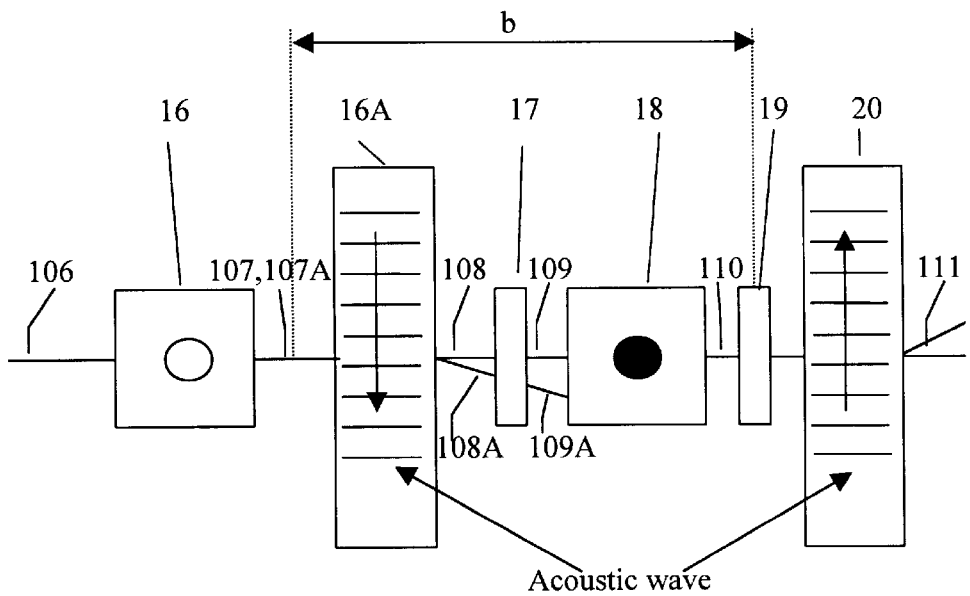
FIG. 5 is an illustration showing the top view of the apparatus illustrated in FIG. 4.

Similarly, for two-axis scanning, the dispersion compensation scanner may employ two acoustooptic devices positioned prior to corresponding acoustooptic deflectors for dispersion compensation. An example of such an implementation for the dispersion compensation scanner is illustrated in FIG. 4 and FIG. 5. Acoustooptic dispersion compensation device 16 is oriented relative to acoustooptic deflector 18 such that the acoustic waves in the acoustic crystals of the acoustooptic device 16 and deflector 18 travel in opposite directions to each other. Similarly, the acoustooptic device 16A and 20 are oriented such that the acoustic waves in the acoustic crystal of the acoustooptic device 16A and deflector 20 travel in opposite directions to each other. The acoustooptic device 16 and deflector 16A and deflectors 18 and 20 are driven at the same center frequency and the acoustic crystals of each are made with the same specifications, such as acoustic velocity and material. The distance "b" illustrated in FIG. 4 is preferably made as short as possible to minimize the ellipticity of the resultant dispersion compensated scanning beam 111. The distance "b" may be considered a distance between an acoustooptical dispersion compensation unit (e.g., comprising devices 16 and 16A) and an acoustooptic deflection unit (e.g., comprising deflectors 18 and 20).

Figure 7:
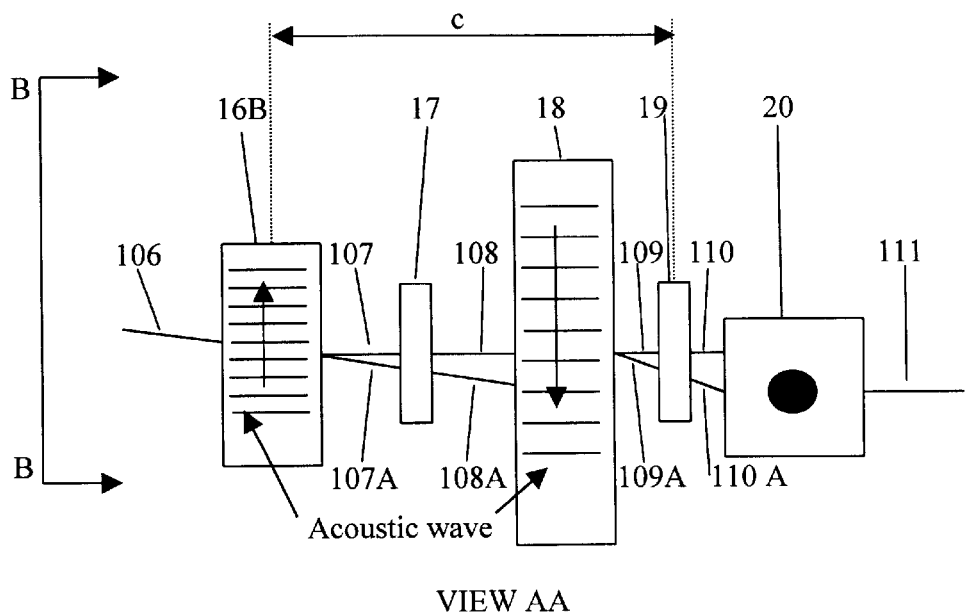
FIG. 7 is an illustration showing the top view (view AA) of the apparatus illustrated in FIG. 6.
Figure 8:
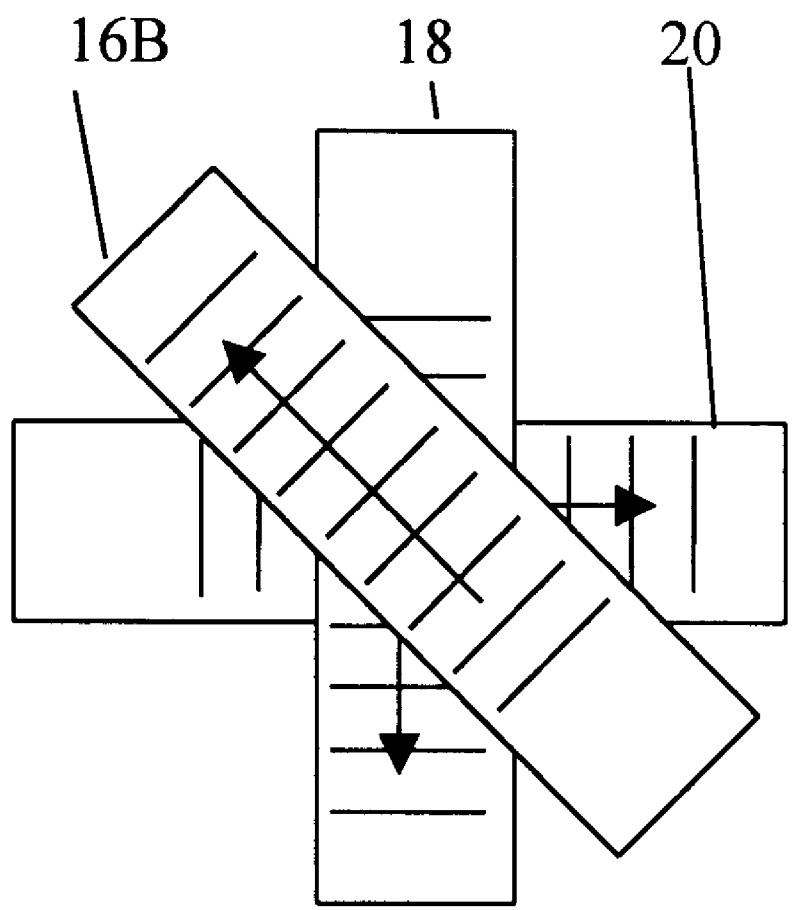
FIG. 8 is an illustration showing another side view (view BB) of FIG. 6.

An alternative exemplary arrangement for the dispersion compensation scanner for two-axis scanning utilizes one acoustooptic dispersion compensation device instead of two such devices as described above with references to FIGS. 4 and 5. Referring to the example illustrated in FIG. 6, FIG. 7 and FIG. 8, a single acoustooptic dispersion compensation device 16B may be employed rather than two acoustooptic devices, such as devices 16 and 16A illustrated in FIG. 4 and FIG. 5. The acoustooptic dispersion compensation device 16B is oriented such that its first-order beam is dispersed along the same axis and direction as that of the resultant beam 111 emanating from the acoustooptic devices 16 and 16A illustrated in FIG. 4. That is, the first-order beam 108 emanating from 16B in FIG. 6 has the same characteristic as that of the first-order beam emanating from 16A in FIG. 4. This result is obtained by orienting the acoustooptic dispersion compensation device 16B such that the acoustic wave in the acoustooptic device is traveling in a direction rotated 135 degrees in the clockwise direction relative to the acoustic wave traveling in the acoustooptic device 16 shown in FIG. 4. In other words, the orientation is such that it produces a dispersed beam 108 emanating from 16B in FIG. 6 of the same characteristic as dispersed beam 111 shown in FIG. 4 (the beam resulting from the effects of the of acoustooptic devices 16 and 16A shown in FIG. 4). It should be noted that the acoustooptic device 16B and deflectors 18 and 20 are preferably designed for the same or different center frequency and that the acoustic crystals are made with the same specifications, such as acoustic velocity and material. The distance "c" in FIG. 6 is preferably made as short as possible to minimize the ellipticity of the resultant dispersion compensated scanning beam 111. The distance "c" may be considered a distance between an acoustooptic dispersion compensation unit (e.g., comprising acoustooptic device 16B) and an acoustooptic deflection unit (e.g., comprising deflectors 18 and 20).

As illustrated in FIG. 6, wave plate 17 is introduced between the acoustooptic device 16B and the acoustooptic deflector 18, and wave plate 19 is introduced between acoustooptic deflectors 18 and 20 to rotate the polarization state of the ultrashort pulsed laser beam to maximize the efficiency of the acoustooptic device. Efficiency in this regard refers to the relative intensities of the first-order scanning beam and the zero-order beam; maximizing the efficiency refers to maximizing the intensity of the first-order scanning beam relative to the zero-order beam.

Figure 2C:
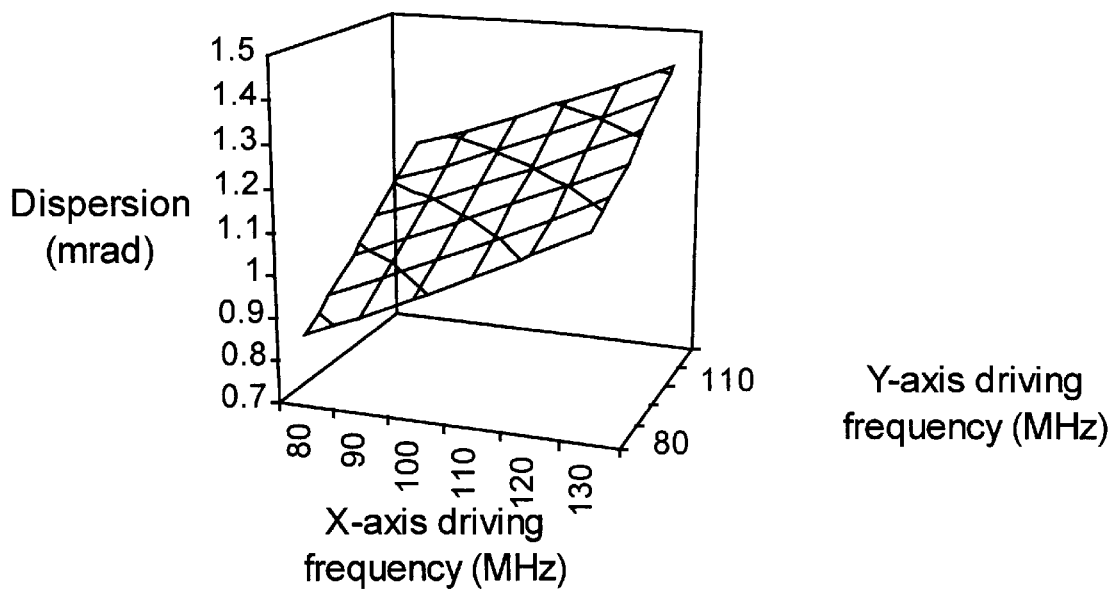
FIG. 2C is an illustration showing the resultant dispersive value due to the two acoustooptic scanners along the entire scan range (as the frequency input to the scanner increases)

As far as a two-axis deflector is concerned, an example of the dispersion angle of the laser beam as a function of bandwidth of driving frequency is shown in FIG. 2C. As illustrated in FIG. 2C, dispersion increases linearly with increasing driving frequency in both scan axes.

For acoustooptic deflectors, the best performance, including intensity stability and spatial quality of the first-order diffraction, can normally be obtained at the center of frequency bandwidth. Accordingly, to achieve the best results (e.g., best machining quality), the target surface can typically be located at the center of the scanning range. Therefore, complete dispersion compensation can be obtained at the central part of the frequency bandwidth.

Figure 2D:
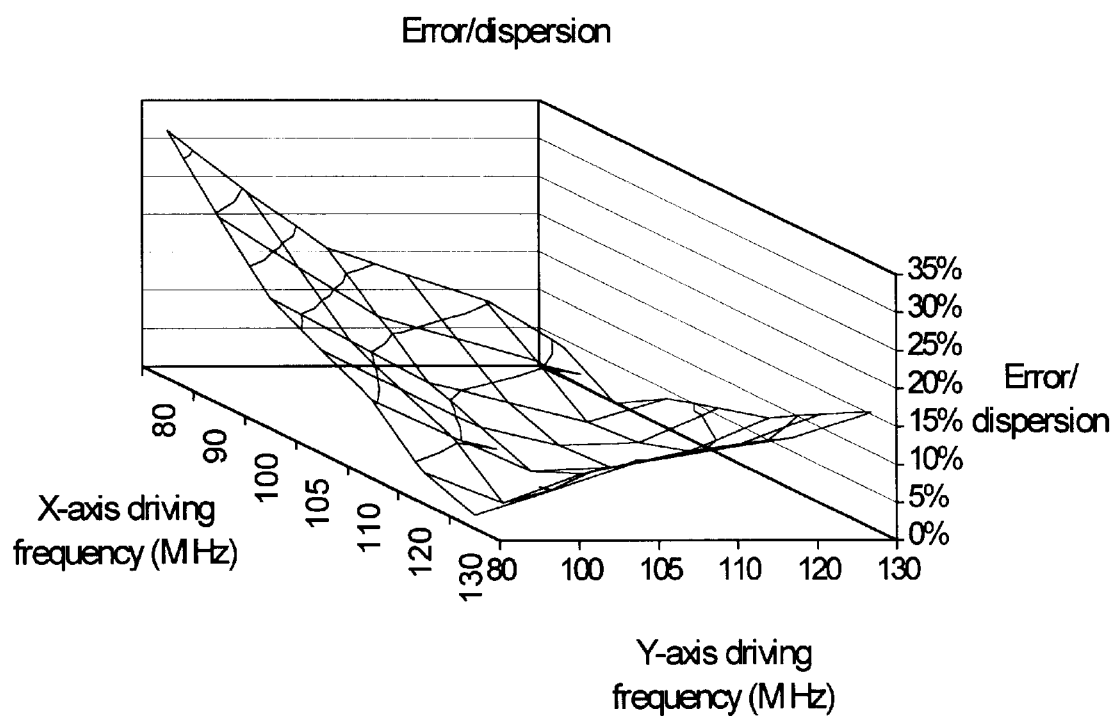
FIG. 2D is an illustration showing the resultant error after dispersion compensation using an acoustooptic device or grating as a dispersion compensating device operating with optimal center frequency or wavelength spacing.

Optimal dispersion compensation can be obtained as shown in FIG. 2D when a dispersion compensation device (e.g., an acoustooptic modulator) is operated with the center frequency of Z MHz, such that $Z=\sqrt{X^2+Y^2}$ where X MHz and Y MHz are the center frequencies of the two acoustooptic deflectors for scanning, respectively. If a diffraction grating is used instead of an accoustooptic device, the grating spacing should be chosen to correspond to the effective grating spacing of an acoustooptic device driven of Z MHz as described above.

A spot completely free of dispersion can be expected at the central point of the scanning range. The ratio of dispersion error to dispersion under this condition is illustrated in FIG. 2D. Dispersion error refers to the amount of uncompensated dispersion.

In addition, FIG. 2D reveals that the ratio of dispersion error to dispersion can be controlled to be under 30% at a dispersion compensating modulator center frequency of Z MHz (or at an equivalent line spacing if a diffraction grating is used). Moreover, the error at the central part of the scanning range can be below 6%. In other words, the center frequency of the dispersion-compensation acoustooptic device can be chosen such that the dispersion compensation is optimized for the entire scanning range. FIG. 2D illustrates X-axis and Y-axis driving frequencies ranging from 80 MHz to 130 MHz (the frequency for Z correspondingly being given by $Z=\sqrt{X^2+Y^2}$), but it should be understood that the driving frequencies are not intended to be limited to these values.

Polarization of the ultrashort pulsed laser beam can improve the efficiency of cutting. The polarization of the ultrashort pulsed laser beam can be varied by a polarization converter (or shifter) 22, which is preferably a half-wave plate, quarter-wave plate or a depolarizer. Moreover, the polarization converter 22 is preferably selectable between these options.

Figure 9:
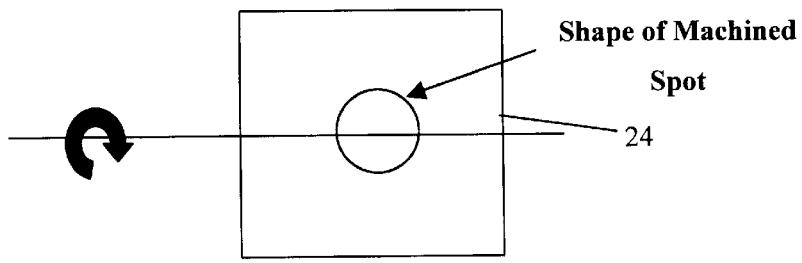
FIG. 9 is an illustration showing the shape of a machined spot using a circularly polarized ultrashort pulsed laser beam.
Figure 10:
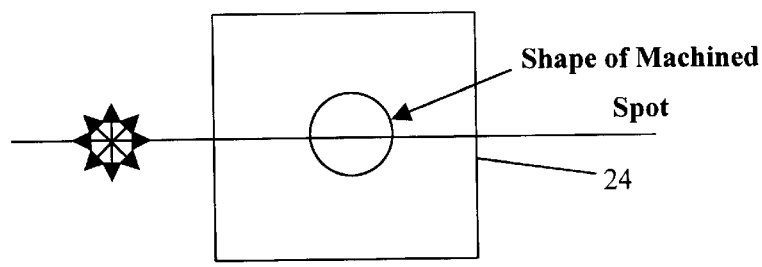
FIG. 10 is an illustration showing the shape of a machined spot using a randomly polarized ultrashort pulsed laser beam.
Figure 11:
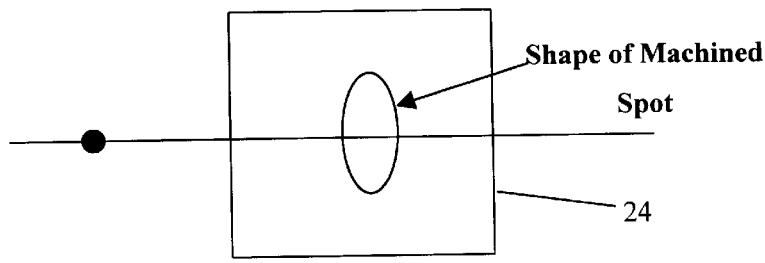
FIG. 11 is an illustration showing the shape of a machined spot using an S-polarized ultrashort pulsed laser beam.
Figure 12:
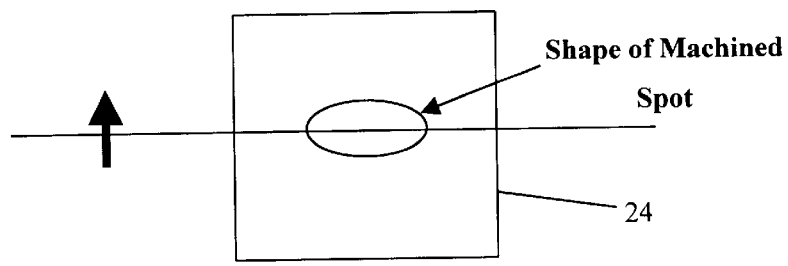
FIG. 12 is an illustration showing the shape of a machined spot using a P-polarized ultrashort pulsed laser beam.

The shape of the machined hole can depend on the polarization state of the ultrashort pulsed laser beam. Referring to FIG. 9, a precision machining apparatus according to the present invention provides a machined hole with a circular shape when the polarization state of the ultrashort pulsed laser beam 113 is circularly polarized by the polarization converter 22, which is preferably a quarterwave plate if the beam incident thereto is linearly polarized. Also, referring to FIG. 10, the machined hole is circular for a randomly polarized ultrashort pulsed laser beam 113 produced by the polarization converter 22, which is preferably a depolarizer or any other means to obtain randomly polarized light. For a linearly polarized state (S or P polarization) of the ultrashort pulsed laser beam 113 produced by the polarization converter 22, which is preferably a half wave plate, the machined hole becomes a narrow groove, such as illustrated in FIG. 11 and FIG. 12, the direction of which depends on the direction of polarization of the beam.

A possible explanation for the polarization-dependent hole shape is that the ultrashort pulsed laser energy is absorbed more predominantly along the direction of the electric field vector. Also, the ablation threshold of the material may depend on the direction of polarization. The ablation threshold of the material may be relatively low for S polarization, circular polarization and random polarization states and relatively higher for a P polarization state. For the present invention, which can provide a polarization-dependent machined hole shape, it is preferable to use a circularly or randomly polarized ultrashort pulsed laser beam for machining complex features in both X and Y directions. For cutting straight lines, S or P polarization states of the ultrashort pulsed laser beam may be applied, depending on the direction of cut. Of course, circularly and randomly polarized beams may be used to cut straight lines as well.

The apparatus and technique of the present invention can be applied for generating complex features with very high precision and accuracy. An apparatus for micromachining and sub-micromachining according to the present invention is capable of producing structures with feature sizes below 100 nm. The ultrashort pulsed laser beam is maneuvered with high positional accuracy and spatial resolution using dispersion compensation acoustooptic deflection apparatus.

Another advantage of the present invention is that the scanning resolution or spatial resolution can be as low as 4 nm or below. And obviously, resolution above 4 nm is possible. The scanning positional accuracy can be as low as 10 ppm (parts per million) or lower. The time for scanning between two arbitrary target spots on the work piece (random access time) can range from 1 nanosecond to 20 micro second depending on the crystal size, laser beam diameter, etc. Obviously, slower scanning speed (longer random access time) is possible. The present invention has the capability for precisely controlling the number of pulses of the ultrashort pulsed laser beam at each target point. Even at very high repetition rates of 300 KHz or more of the ultrashort pulsed laser, the number of pulses can be controlled down to one pulse at each target point. The pulse-controlling factor depends on the rise time of the acoustooptic crystals in the acoustooptic deflectors and dispersion compensation devices. Precise pulse control, high position accuracy, and high scanning resolution in nanometer range is beneficial to machine or ablate complex features on the surface of the work piece 24. Another advantage of the present invention is the utilization of acoustooptic deflectors and acoustooptic dispersion-compensation devices for scanning, thereby providing a non-mechanical scanning system. As a result, the system is substantially immune to vibration even at very high scanning speeds. This attribute is advantageous for machining sub-micron-scale, nanometer-scale and micron-scale features.

As noted in U.S. patent application No. 09/307,710 now U.S. Pat. No. 6,285,002 referenced above, the present invention can provide features smaller than the focused spot size of the ultrashort pulsed laser beam by precisely controlling the ultrashort pulsed laser beam above the ablation threshold of the material. To achieve such features, the number of pulses at each machining point should be precisely controlled and optimized for different feature sizes. In addition to the ultrashort pulsed laser energy and the number of ultrashort laser pulses, the variation or fluctuation in the energy of the ultrashort laser pulses can affect the smallest feature size achievable. Smaller fluctuations/variations of the ultrashort laser pulse energy may allow smaller machined feature sizes to be achieved. Machined feature sizes of less than one twentieth of the focused beam spot size can be obtained by controlling the energy of the ultrashort laser pulses, the number of pulses incident at a given target spot, and the energy fluctuation of ultrashort pulsed laser beams.

The present invention has wide application in micron or sub-micron contour formation, direct fabrication of photolithographic masks (photomasks) at very high speed, precise and accurate machining of metals and other materials, thin film patterning, and other applications. Currently photomasks are fabricated by using lithographic processes, which are expensive and time consuming given the multiple steps involved in the fabrication process. Using the present invention, however, photomasks can be fabricated by a single-step machining process, where the absorbing layer of a mask blank is directly removed using ultrashort pulsed laser ablation without affecting the transparent substrate. For example, referring to FIG. 13, a mask blank (work piece) comprises a transparent substrate 302 (e.g., transparent to UV radiation), on which a coating layer 300, which has good absorption to ultraviolet (UV) radiation, has been deposited. The UV absorbing material can be chromium, gold, platinum, tungsten, molybdenum, other refractory metals, alloys thereof, and the like. The thickness of the deposited layer 300 can vary according to the process. If the coating layer 300 does not have a good adherence to the substrate 302, a thin bonding layer 301, which has good adherence to substrate 302, may be coated onto the substrate 302 prior to applying the coating layer 300.

Figure 13:
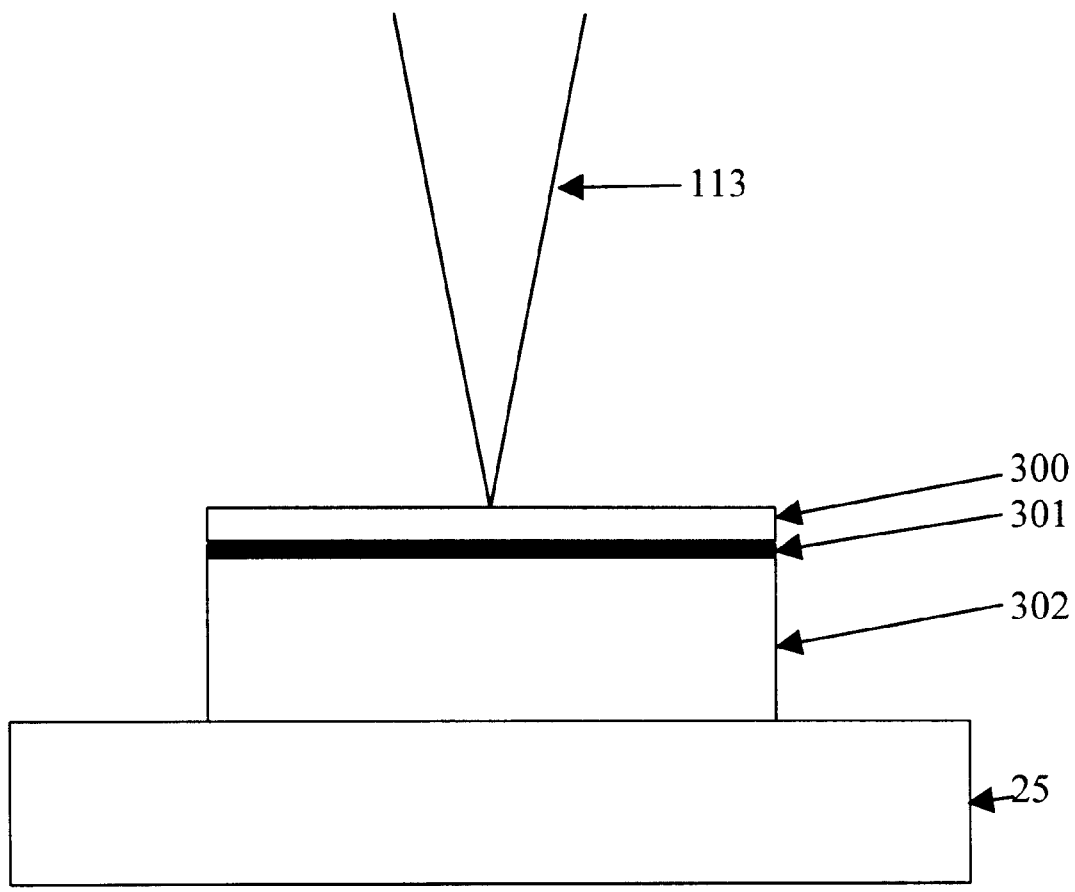
FIG. 13 is an illustration of photomask fabrication using an ultrashort pulsed laser beam prior to ablation of the absorbing layer of the mask blank.
Figure 14:
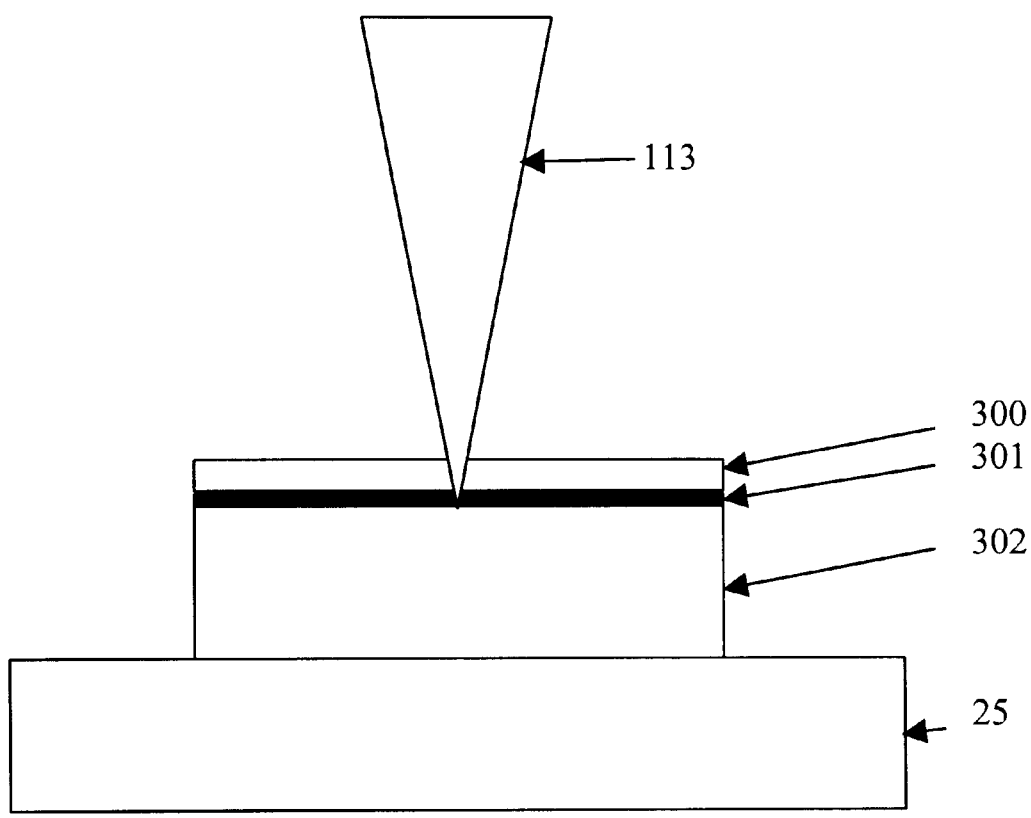
FIG. 14 is an illustration of photomask fabrication using an ultrashort pulsed laser beam during ablation of the absorbing layer of the mask blank.

Referring to FIG. 13, the substrate 302 is mounted on the stage 25. The pulse energy of the laser beam 113 is controlled such that the energy is sufficient to ablate or remove the material from the layers 300 and 301 but not sufficient to ablate material from the substrate 302. As shown in FIG. 14, the ultrashort pulsed laser beam 113 ablates or removes material from layers 300 and 301 without removing material from the substrate 302. This can be achieved by choosing the materials and/or the process parameters such that the threshold energy for removing the substrate material 302 is higher than that for removing material from coating layers 300 and 301. Using the present invention, a photomask having complex features can be fabricated in a single step by scanning the ultrashort pulsed laser beam using acoustooptic devices. The stage 25 allows translating the mask blank between machining periods. This approach can be faster and more cost effective compared to conventional lithographic processes and is capable of fabricating photomasks with sub-micron features.

In addition, the apparatus and technique of the present invention can be utilized for cleaning the surfaces of work pieces by an entirely dry process using ultrashort pulsed laser beams (preferably with pulse widths of approximately one picosecond to one femtosecond). The intensity and energy of the ultrashort pulsed laser beam 113 can be precisely controlled by varying the efficiency of the acoustooptic devices or by any other precise intensity control mechanism. Efficiency of the acoustooptic devices can be controlled by varying the input power to the respective acoustooptic crystals (for lower input power, efficiency and hence beam intensity are lower, and vice versa). The intensity is controlled such that the energy delivered to any spot on the work piece 24 is lower than the ablation threshold of the work piece 24. The beam is then scanned over the work piece sample one or more times depending on the requirement of cleaning efficiency. Using an ultrashort pulsed laser beam of pulse width in the range of one picosecond to one femtosecond for cleaning has a number of advantages. For example, subsurface damage is absent or very minimal, damage to sensitive parts is avoided, the method is suitable for selective area cleaning, there is no need for liquids and hence no hydrostatic shock (the process is dry), and very small contaminant particles (e.g., dust particles) including particles smaller than 100 nm, can be removed.

The invention has been described with reference to exemplary embodiments. However, it will be readily apparent to those skilled in the art that it is possible to embody the invention in specific forms other than those of the embodiments described above. This may be done without departing from the spirit of the invention. The exemplary embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A precision laser-scanning apparatus, comprising:
   a laser source that emits a pulsed laser beam;
   a dispersion compensation scanner that includes at least one acoustooptic device and that scans the pulsed laser beam; and
   a focusing unit that focuses the pulsed laser beam from the dispersion compensation scanner onto a work piece, wherein the dispersion compensation scanner comprises a first scanning device that scans the pulsed laser beam in a first direction and that causes dispersion of the pulsed laser beam, and a first dispersion compensation device that compensates for the dispersion caused by the first scanning device.

2. The apparatus of claim 1, wherein the pulsed laser beam has a wavelength in a range of approximately 100 nm to approximately 1500 nm, a pulse width in a range of approximately 1 microsecond to approximately 1 femtosecond, and a pulse repetition rate in a range of approximately 10 hertz to approximately 100 megahertz.

3. The apparatus of claim 1, wherein the dispersion compensation scanner has a scanning resolution in a range of approximately 1 nm to approximately 100 microns depending on the scanning range.

4. The apparatus of claim 1, wherein a pulse energy and an intensity of the pulsed laser beam are sufficient to machine a surface of work piece.

5. The apparatus of claim 4, wherein the apparatus has a spatial machining resolution in the range of approximately 0.05 micron to approximately 100 micron.

6. The apparatus of claim 4, wherein the apparatus has a spatial machining resolution of approximately one-twentieth of a cross-sectional diameter of the pulsed laser beam in a focused state at the surface of the work piece.

7. The apparatus of claim 4, further comprising a polarization converter that provides a polarization state to the pulsed laser beam.

8. The apparatus of claim 7, wherein the polarization converter is selected from the group consisting of a quarter-wave plate, a half-wave plate, and a depolarizer.

9. The apparatus of claim 7, wherein the polarization converter is selected to provide the polarization state depending upon a desired shape of a machined feature to be generated on a surface of the work piece or depending upon an ablation threshold of the work piece.

10. The apparatus of claim 7, wherein the polarization state is selected to be one of a linear polarization state for machining an elliptical feature, a circular polarization state for machining a circular feature, and a random polarization state for machining a circular feature.

11. The apparatus of claim 7, further comprising a beam filter that spatially filters the pulsed laser beam and provides the pulsed laser beam with a desired cross-sectional size.

12. The apparatus of claim 11, wherein the beam filter comprises:

a pin hole with a diameter approximately equal to or greater than a desired spot size of the pulsed laser beam when focused onto the work piece;

a first focusing lens that focuses the pulsed laser beam onto the pin hole;

a second focusing lens that collimates the pulsed laser beam emanating from the pin hole; and a diaphragm that blocks an outer portion of the pulsed laser beam emanating from the second focusing lens.

13. The apparatus of claim 1, wherein the dispersion compensation scanner further comprises:

a second scanning device that scans the pulsed laser beam in a second direction different from the first direction and that causes dispersion of the pulsed laser beam, wherein the first dispersion compensation device compensates for dispersion caused by both the first scanning device and the second scanning device.

14. The apparatus of claim 13, wherein the first and second scanning devices are acoustooptic devices and wherein the first dispersion compensation device is a diffraction grating having a line spacing suitable for compensating the dispersion caused by the first and second scanning devices.

15. The apparatus of claim 13, wherein the first scanning the device, the second scanning device and the first dispersion compensation device are acoustooptic devices.

16. The apparatus of claim 15, wherein the first and second scanning devices are acoustooptic deflectors and wherein the first dispersion compensation device is an acoustooptic modulator that further provides modulation of the pulsed laser beam wherein the beam is selectively transmitted or blocked.

17. The apparatus of claim 15, wherein dispersion compensation provided by the first dispersion compensation device results in a dispersion error below approximately 30% over the entire scan range.

18. The apparatus of claim 15, wherein the first and second scanning devices are oriented such that the first direction is perpendicular to the second direction and wherein the first dispersion compensation device is oriented at an angle relative to the first scanning device such that the first dispersion compensation device produces a negative dispersion that counters the resultant dispersion caused by the first and second scanning devices.

19. The apparatus of claim 15, wherein the first compensation device, the first scanning device and the second scanning device are made of the same material and have the same acoustic velocity, and wherein the center acoustic frequency of the first compensation device is chosen such that dispersion compensation is optimized for the entire scanning range of the apparatus, the first dispersion compensation device being operated with the center frequency of Z MHz, given by $Z=\sqrt{X^2+Y^2}$, where X MHz and Y MHz are the center frequencies of the first and second scanning devices, respectively.

20. The apparatus of claim 1, wherein the dispersion compensation scanner further comprises:

a second scanning device that scans the pulsed laser beam in a second direction different from the first direction and that causes dispersion of the pulsed laser beam; and a second dispersion compensation device that compensates for dispersion caused by the second scanning device.

21. The apparatus of claim 20, wherein the first and second scanning devices are acoustooptic devices and wherein the first and second dispersion compensation devices are diffraction gratings having a line spacing suitable for compensating the dispersion caused by the first and second scanning devices.

22. The apparatus of claim 20, wherein the first and second scanning devices and the first and second dispersion compensation devices are acoustooptic devices.

23. The apparatus of claim 22, wherein the first and scanning devices are acoustooptic deflectors and wherein the first and second dispersion compensation devices are acoustooptic modulators that further provide modulation of the pulsed laser beam wherein the pulsed laser beam is selectively transmitted or blocked.

24. The apparatus of claim 22, wherein the first and second scanning devices are oriented such that the first direction is perpendicular to the second direction and wherein the first and second dispersion compensation devices are oriented such that a direction of an acoustic wave in the first dispersion compensation device is perpendicular to a direction of an acoustic wave in the second dispersion compensation device, the first and second dispersion compensation devices producing a negative dispersion that counters the resultant dispersion caused by the first and second scanning devices.

25. The apparatus of claim 22, wherein dispersion compensation provided by the first and second dispersion compensation devices results in a dispersion error below approximately 30% over the entire scan range.

26. The apparatus of claim 22, wherein the first and second compensation devices and the first and second scanning devices are made of the same material and have the same acoustic velocity, and wherein the center acoustic frequency of the first and second dispersion compensation devices is chosen such that dispersion compensation is optimized for the entire scanning range of the apparatus.

27. A precision laser-scanning apparatus, comprising:
a laser source that emits a pulsed laser beam;
a dispersion compensation scanner that scans the pulsed laser beam; and
a focusing unit that focuses the pulsed laser beam from the dispersion compensation scanner onto a work piece, wherein the dispersion compensation scanner comprises
a first scanning device that scans the pulsed laser beam in a first direction and that causes dispersion of the pulsed laser beam, and
a first dispersion compensation device that compensates for the dispersion caused by the first scanning device; wherein the scanning random access time of the dispersion compensation scanner is in a range of approximately 1 nanoseconds to 100 microseconds.

28. A method of scanning a pulsed laser beam on a work piece for machining or cleaning the work piece, comprising:
emitting a pulsed laser beam from a laser source;
focusing the pulsed laser beam on the work piece;
scanning the pulsed laser beam on the work piece using a first acoustooptical scanning device that scans the pulsed laser beam in a first direction and that causes dispersion of the pulsed laser beam; and
compensating for the dispersion caused by the first scanning device using a first dispersion compensation device.

29. The method of claim 28, wherein the pulsed laser beam has a wavelength in a range of approximately 100 nm to approximately 1500 nm, a pulse width in a range of approximately 1 microsecond to approximately 1 femtosecond, and a pulse repetition rate in a range of approximately 10 hertz to approximately 80 megahertz.

30. The method of claim 28, further comprising machining a surface of the work piece by ablating material from the surface.

31. The method of claim 30, wherein the machining has a spatial resolution in the range of approximately 0.05 micron to approximately 100 micron.

32. The method of claim 30, further comprising converting a polarization of the pulsed laser beam to a predetermined polarization state prior to scanning the pulsed laser beam on the work piece.

33. The method of claim 32, further comprising selecting the predetermined polarization state depending upon a desired shape of a machined feature to be generated on a surface of the work piece or depending upon an ablation threshold of the work piece.

34. The method of claim 32, further comprising spatially filtering the pulsed laser beam to provide the pulsed laser beam with a desired cross-sectional size.

35. The method of claim 28, further comprising:
scanning the pulsed laser beam in a second direction different from the first direction using a second scanning device that causes dispersion of the pulsed laser beam; and
compensating for dispersion caused by both the first scanning device and the second scanning device using the first dispersion compensation device.

36. The method of claim 35, wherein the first scanning the device, the second scanning device and the first dispersion compensation device are acoustooptic devices.

37. The method of claim 36, further comprising modulating the pulsed laser beam using the first dispersion compensation device, the first dispersion compensation device being an acoustooptic modulator.

38. The method of claim 36, wherein dispersion compensation provided by the first dispersion compensation device results in a dispersion error below approximately 30% over the entire scan range.

39. The method of claim 28, further comprising:
scanning the pulsed laser beam in a second direction different from the first direction using a second scanning device that causes dispersion of the pulsed laser beam; and
compensating for dispersion caused by the second scanning device using a second dispersion compensation device.

40. The method of claim 39, wherein the first and second scanning devices and the first and second dispersion compensation devices are acoustooptic devices.

41. The method of claim 40, further comprising modulating the pulsed laser beam using the first and second dispersion compensation devices, the first and second dispersion compensation devices being acoustooptic modulators.

42. The method of claim 40, wherein dispersion compensation provided by the first and second dispersion compensation devices results in a dispersion error below approximately 30% over the entire scan range.

43. The method of claim 40, for use in the direct fabrication of a photomask, wherein said work piece comprises a substrate transparent to ultra violet (UV) radiation and a UV absorbing layer disposed on said substrate, the method further comprising:
controlling the energy of the ultrashort pulse laser beam such that the energy is sufficient to remove at least a portion of the UV absorbing layer while not removing material from the substrate.

44. The method of claim 40, wherein said UV absorbing layer is selected from the group consisting of chromium, gold, platinum, tungsten, molybdenum, and alloys thereof.

45. The method of claim 40, for use in cleaning at least a portion of the work piece, the method further comprising:
controlling the intensity of the pulsed laser beam such that the energy delivered to any location on the work piece is lower than an ablation threshold of the work piece, whereby contaminant particles are removed from said at least a portion of the work piece.

46. The method of claim 45, wherein said contaminant particles comprise particles smaller than approximately 100 nm in diameter.

47. A method of scanning a pulsed laser beam on a work piece for machining or cleaning the work piece, comprising:
emitting a pulsed laser beam from a laser source;
focusing the pulsed laser beam on the work piece;
converting a polarization of the pulsed laser beam to a predetermined polarization state prior to scanning the pulsed laser beam on the work piece;

scanning the pulsed laser beam on the work piece using a first scanning device that scans the pulsed laser beam in a first direction and that causes dispersion of the pulsed laser beam;

compensating for the dispersion caused by the first scanning device using a first dispersion compensation device; and machining a surface of the work piece by ablating material from the surface.

48. A method of scanning a pulsed laser beam on a work piece for machining or cleaning the work piece, comprising:

emitting a pulsed laser beam from a laser source;

focusing the pulsed laser beam on the work piece;

scanning the pulsed laser beam on the work piece using a first scanning device that scans the pulsed laser beam in a first direction and that causes dispersion of the pulsed laser beam;

compensating for the dispersion caused by the first scanning device using a first dispersion compensation device;

scanning the pulsed laser beam in a second direction different from the first direction using a second scanning device that causes dispersion of the pulsed laser beam; and compensating for dispersion caused by both the first scanning device and the second scanning device using the first dispersion compensation device.

49. A precision laser-scanning apparatus, comprising:

a laser source that emits a pulsed laser beam;

a beam filter that spatially filters the pulsed laser beam and provides the pulsed laser beam with a desired cross-sectional size; wherein the beam filter includes a pin hole with a diameter approximately equal to or greater than a desired spot size of the pulsed laser beam when focused onto the work piece; a first focusing lens that focuses the pulsed laser beam onto the pin hole; a second focusing lens that collimates the pulsed laser beam emanating from the pin hole; and a diaphragm that blocks an outer portion of the pulsed laser beam emanating from the second focusing lens;

a dispersion compensation scanner that scans the pulsed laser beam, wherein the dispersion compensation scanner comprises a first scanning device that scans the pulsed laser beam in a first direction and that causes dispersion of the pulsed laser beam, and a first dispersion compensation device that compensates for the dispersion caused by the first scanning device;

a focusing unit that focuses the pulsed laser beam from the dispersion compensation scanner onto a work piece; and a polarization converter that provides a polarization state to the pulsed laser beam; wherein a pulse energy and an intensity of the pulsed laser beam are sufficient to machine a surface of work piece.

* * * * *